United States Patent
Raeen

(10) Patent No.: US 12,082,507 B2
(45) Date of Patent: *Sep. 3, 2024

(54) ELECTRIC DEVICE

(71) Applicant: RAEENTEK LLC, Los Angeles, CA (US)

(72) Inventor: Bahram Raeen, Santa Monica, CA (US)

(73) Assignee: RAEENTEK, LLC, Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/514,104

(22) Filed: Nov. 20, 2023

(65) Prior Publication Data

US 2024/0206343 A1    Jun. 20, 2024

Related U.S. Application Data

(63) Continuation of application No. 17/828,636, filed on May 31, 2022, now abandoned, which is a continuation of application No. 16/719,434, filed on Dec. 18, 2019, now abandoned, which is a continuation-in-part of application No. 16/190,029, filed on Nov. 13, 2018, now Pat. No. 11,811,264, which is a continuation-in-part of application No. PCT/US2017/025168, filed on Mar. 30, 2017, which (Continued)

(51) Int. Cl.
| | |
|---|---|
| *H02N 11/00* | (2006.01) |
| *H10N 35/00* | (2023.01) |
| *H10N 35/80* | (2023.01) |

(52) U.S. Cl.
CPC ......... *H10N 35/101* (2023.02); *H02N 11/002* (2013.01); *H10N 35/80* (2023.02)

(58) Field of Classification Search
CPC ..... H02N 11/002; H02N 11/008; Y10S 74/09; H02K 53/00
See application file for complete search history.

(56) References Cited

U.S. PATENT DOCUMENTS

| 4,052,630 A | 10/1977 | Inariba |
| 5,334,899 A | 8/1994 | Skybyk |
| (Continued) | | |

FOREIGN PATENT DOCUMENTS

| AU | 2015323900 A1 | 3/2017 |
| AU | 2019279969 B2 | 4/2023 |
| (Continued) | | |

OTHER PUBLICATIONS

International Preliminary Report on Patentability issued in PCT/US2017/025168, dated Aug. 13, 2019.

(Continued)

*Primary Examiner* — Ramon M Barrera
(74) *Attorney, Agent, or Firm* — Wilson Sonsini Goodrich & Rosati

(57) ABSTRACT

An electric generator comprises a substantially flat magnet having a series of alternating north and south polarities, the magnet having an upper surface, a lower surface and opposing edges. A first metal plate formed on the upper surface of the magnet, and a second metal plate formed on the lower surface of the magnet. A pair of wires is connected to one of the first or second metal plates and an edge of the magnet, the pair of wires capturing for use energy or power produced by the electric generator.

19 Claims, 11 Drawing Sheets

Related U.S. Application Data is a continuation-in-part of application No. 15/431,078, filed on Feb. 13, 2017, now abandoned, which is a continuation-in-part of application No. PCT/US2015/052961, filed on Sep. 29, 2015, which is a continuation-in-part of application No. 14/608,101, filed on Jan. 28, 2015, now abandoned.

(60) Provisional application No. 62/872,642, filed on Jul. 10, 2019, provisional application No. 62/058,019, filed on Sep. 30, 2014.

(56) References Cited

U.S. PATENT DOCUMENTS

| | | |
|---|---|---|
| 6,707,208 B2 | 3/2004 | Durham et al. |
| 8,242,661 B2 | 8/2012 | Asano |
| 9,356,477 B2 | 5/2016 | Nakamura |
| 9,948,169 B2 | 4/2018 | Jang |
| 10,110,109 B2 | 10/2018 | Farquharson |
| 11,811,264 B1 | 11/2023 | Raeen |
| 2007/0205691 A1 | 9/2007 | Hattori et al. |
| 2009/0001833 A1 | 1/2009 | Freixas Vila |
| 2010/0007233 A1 | 1/2010 | Sozanski |
| 2011/0012461 A1 | 1/2011 | Tomigashi |
| 2013/0176091 A1 | 7/2013 | Lancaster-Larocque |
| 2016/0036310 A1 | 2/2016 | Letts |
| 2016/0094157 A1 | 3/2016 | Raeen |
| 2017/0237305 A1 | 8/2017 | Raeen |

FOREIGN PATENT DOCUMENTS

| | | |
|---|---|---|
| EP | 3202021 A1 | 8/2017 |
| JP | 2013505698 A | 2/2013 |
| WO | WO-0200492 A1 | 1/2002 |
| WO | WO-2005043722 A1 | 5/2005 |
| WO | WO-2016054052 A1 | 4/2016 |

OTHER PUBLICATIONS

International Search Report and Written Opinion issued in PCT/US2017/025168, mailed Jun. 16, 2017.

PCT/US2015/052961 ISRWO dated Jan. 7, 2016.

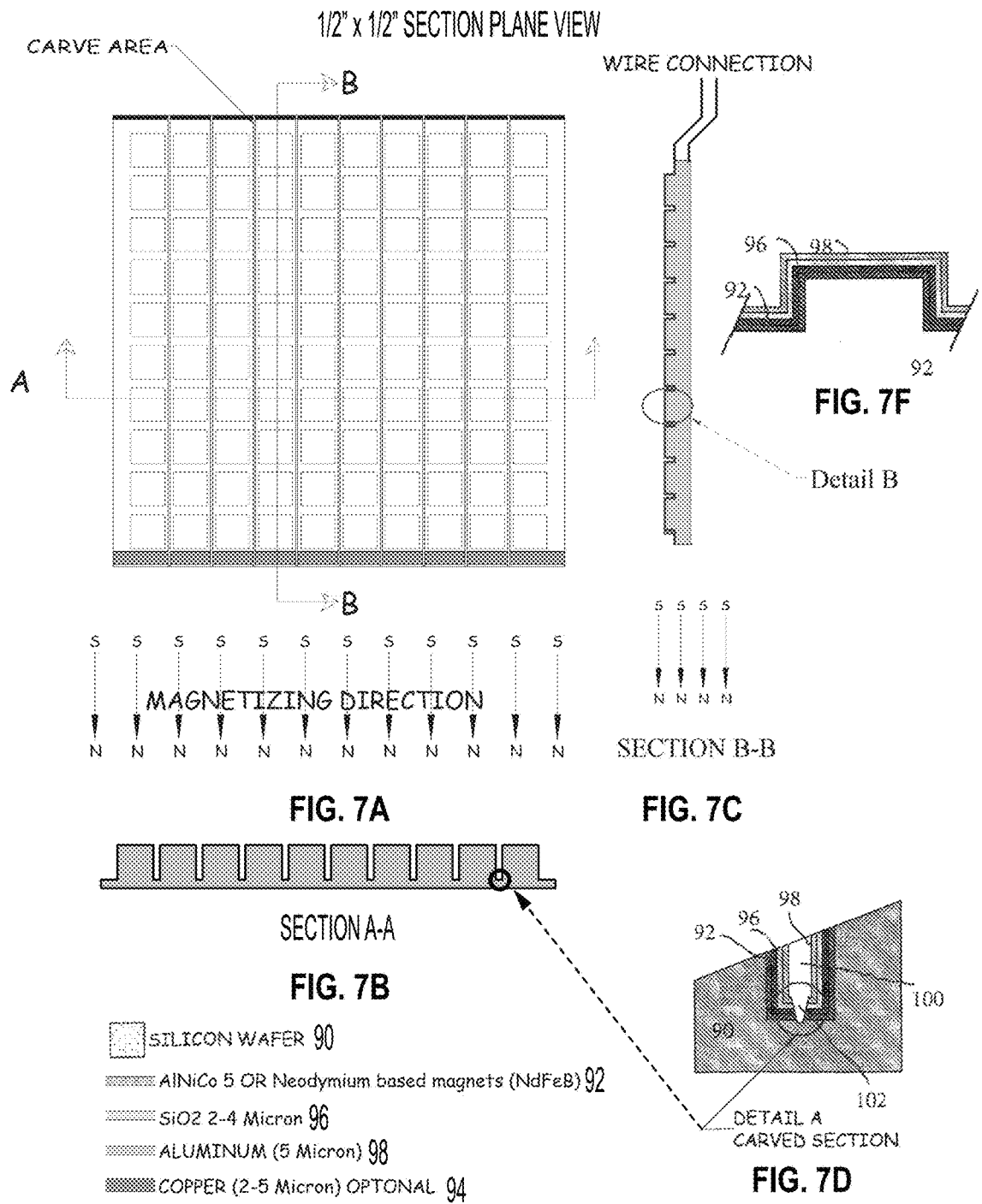

130.PROV AMENDED FOR INCORPORATION IN NEW SPECIFICATION
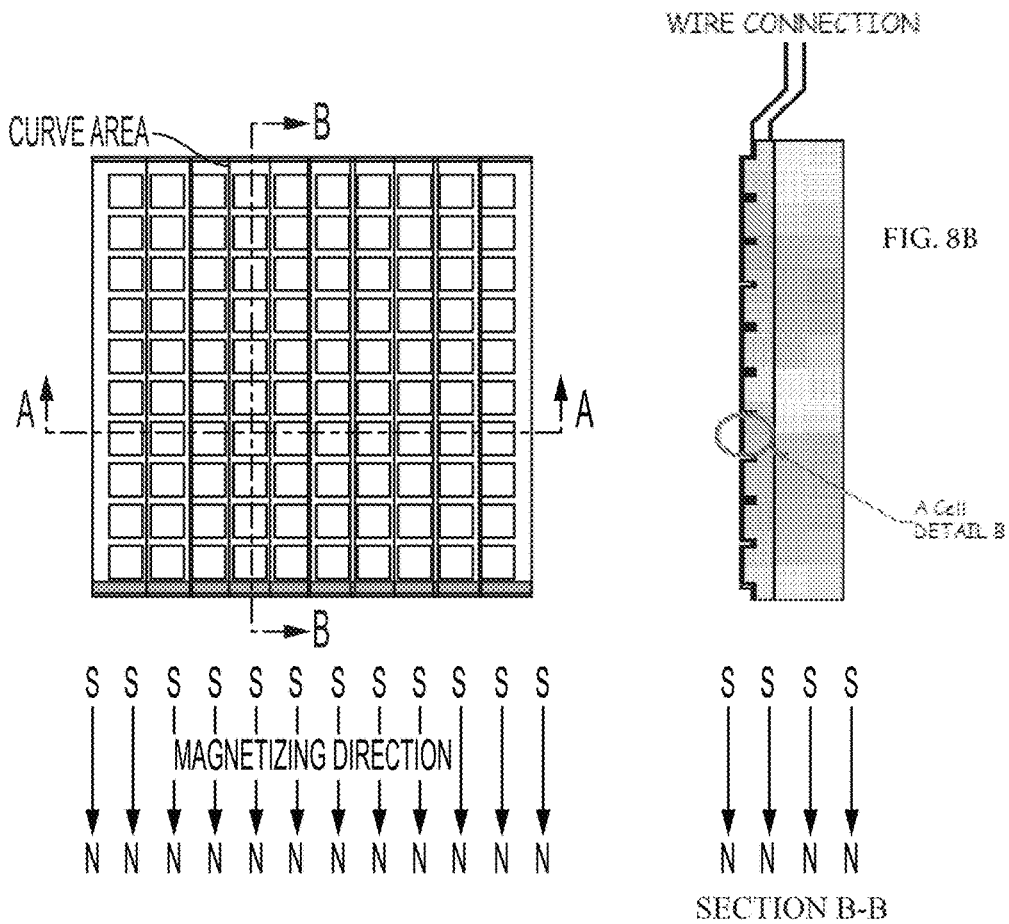
FIG. 8A
FIG. 8B
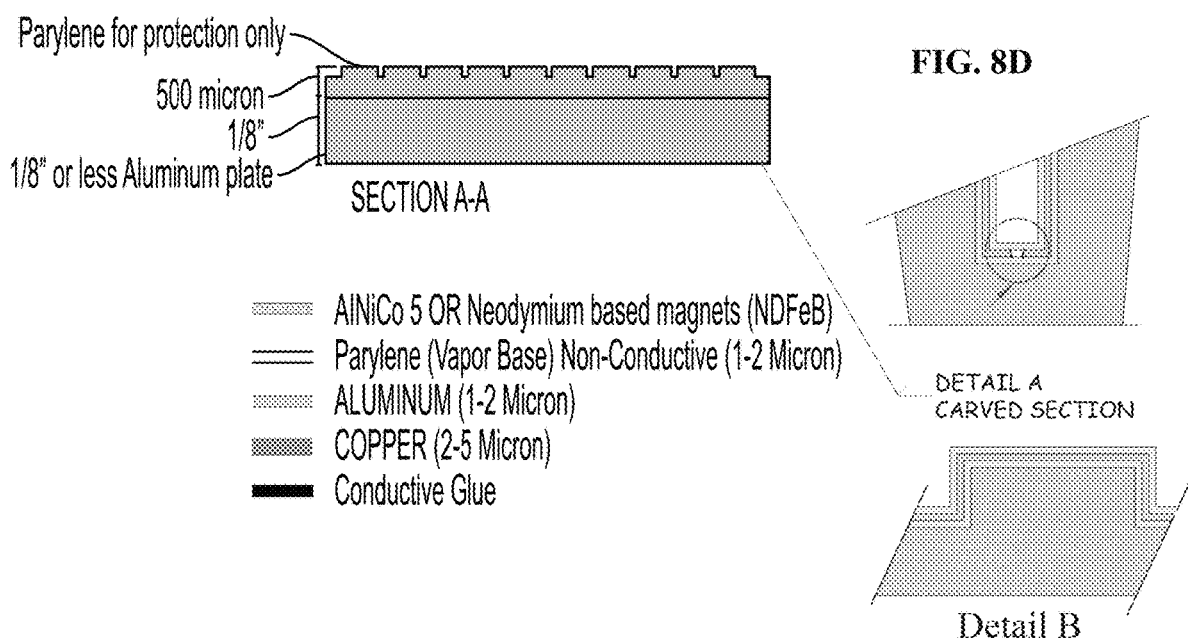
FIG. 8C
FIG. 8D
FIG. 8E

ELECTRIC DEVICE

CROSS REFERENCE TO RELATED U.S. APPLICATIONS

This application is a continuation of U.S. patent application Ser. No. 17/828,636, filed May 31, 2022, which is a continuation application of U.S. patent application Ser. No. 16/719,434 filed Dec. 18, 2019, which claims the benefit of U.S. Provisional Patent Application No. 62/872,642 filed Jul. 10, 2019, and is a continuation in part application of U.S. patent application Ser. No. 16/190,029 filed Nov. 13, 2018, now U.S. Pat. No. 11,811,264 issued Nov. 7, 2023, which is a continuation in part application of PCT International Application No. PCT/US17/25168 filed Mar. 30, 2017, which is a continuation in part application of U.S. patent application Ser. No. 15/431,078 filed Feb. 13, 2017, which is a continuation in part application of PCT/US15/52961 filed Sep. 29, 2015, which is a continuation in part of U.S. patent application Ser. No. 14/608,101 filed Jan. 28, 2015, which claims the benefit of U.S. Provisional Patent Application No. 62/058,019 filed Sep. 30, 2014. All of the above applications are incorporated herein by reference in their entirety. each of which is incorporated herein by reference in its entirety.

FIELD AND BACKGROUND OF THE INVENTION

This is invention relates to an electric device or generator. More particularly, the invention relates to an electric device or generator which utilizes magnets which are sandwiched by one or more selected layers of metals. The configuration and construction of the electric device or generator of the invention may produce a flow of mass particles, which can be controlled and harnessed, and whereby a charge flow is setup within the system which can be utilized for the extraction of power or energy to form the electric generator of the invention.

SUMMARY OF THE INVENTION

According to one aspect of the invention, there is provided an electric or magnetic device or generator comprising: a substantially flat magnet having a series of alternating or varying north and south polarities, or even just one directional north south, the magnet having an upper surface, a lower surface and opposing edges; a first metal plate formed on the upper surface of the magnet; a second metal plate formed on the lower surface of the magnet; and a pair of wires connected to one of the first or second metal plates and any point at the edge of the magnet, the pair of wires capturing energy or power produced by the electric device.

Preferably, the first metal plate is comprised of aluminum foil, and the second metal plate is comprised of aluminum foil.

An additional metal plate may be mounted over either of the first or second metal plates. The additional metal plate may be comprised of copper.

In one embodiment, the magnet comprises a series portions of alternating north and south polarities. One of the pair of wires may be connected to the first metal plate and the other of the pair of wires may be connected to a metal rod extending from an edge of the magnet or directly to the magnet or a metal plate thereof. Any point on the edge of the magnet may produce different amounts of electricity which may not be related to that of the other edge points of the magnet.

Additionally, a diode may optionally be provided in the wire extending from an edge of the magnet. A plurality of such electric devices may be connected to each other, either in series, in parallel, or a combination thereof.

In one embodiment, the thickness of the magnet is approximately 1/16 inches. Further, the magnet may have dimensions which are approximately 1"×1"×0.0505".

In another form of the invention, a film is provided between the copper layer and either the first metal plate or second metal plate to reduce deterioration of the metals.

According to a further aspect of the invention, there is provided a method of generating electricity comprising: providing a substantially flat magnet having alternating north and south polarities, the magnet having upper and lower surfaces; placing and aluminum layer over both the upper and lower surfaces of the magnet; placing an additional metal layer over at least one of the upper or lower surfaces to cover the aluminum layer; and capturing power or energy generated by the system by connecting wires across the electric generator.

Preferably, the additional metal layer is copper. A diode may be located in the wires to facilitate an increase in the amount of direct voltage and amperage generated by the system. Further, a plurality of such magnets may be joined in series, in parallel, or a combination of both.

Some background definitions and theories are set forth which may possibly help explain the electric device or generator of the present invention.

A. Energy:
Energy is mass in motion ($E=1/2M{\times}V^2$).

B. Mass Particles:
Mass particles are the smallest particles that are contained in our universe. The spatial size of a mass particle is three-dimensional. The volume of space a particle possesses is yet to be measured, but for the purposes of this description it is proposed to be finite and specific. The mass particle may have close to zero volume, although a mass particle may never in fact attain zero volume.

C. Charge:
Charge may be considered as comprising clusters of small mass particles in size that may move within wires.

D. Magnetic Field (Storm):
The directional movement of mass with respect to other mass in a counter parallel direction produces what we call the electromagnetic forces. The charge propagated down the current is the electric charge. The force that forms outside of the movement of charge, that is perpendicular to the direction of the flow of charge, is the magnetic field. The magnetic energy field that surrounds the directional current of electric charge is in fact mass particles in motion. These mass particles are much smaller than the particles of quarks, electrons or protons. Our technology permits us to detect the presence of particles up to a certain size.

E. Electrons do not move from one atom to another. Atomic clouds that surround atoms move from one atom to another one. Movement of the atomic clouds (mass particles) produce energy that can become electricity. The property and density of clouds dictate the shape of the material. With a change in temperature, density of the atomic clouds surrounding each atom will be reduced or increased. Therefore, material shapes change from vapor to liquid and to solid or the reverse thereof.

The magnetic storm has the ability to move atomic clouds (mass particles) from one atom to another. Reduction or excess of atomic clouds around an atom will make the atom unstable in the substance, and therefore atoms will try to balance their fields, and with that, the motion of atomic clouds (mass particle) will be detected in the field. The differential of mass clouds within atoms to atoms or substance to substance produce electricity.

The generator of the invention disclosed herein preferably utilizes and capitalizes on the description set forth above.

The nature of a magnet is to provide directional movement of mass particles in the space field. This directional movement will affect any atoms that are located nearby, even though that might not be noticeable. The first effect is that the atomic clouds surrounding atoms will be disturbed, by either being moved from the atomic field, or by some more masses being added to the field. Atomic clouds (mass particles) that are attacked by this storm will move in the space in the same direction as that of the magnetic field. The stability of the shape of any atoms in a cluster as a substance mainly depend on the amount of clouds surrounding them. The thickness and concentration of the masses in the clouds will determine and dictate the substance shape. Therefore, atoms immediately try to fill the lost clouds by absorbing any particles existing in the surrounding field or other fields. These movements of mass particles in the field, by the definition of charge (see above), are considered to act as charge and provide voltage in the system.

The electric device or generator of the present invention may be made from two (2) aluminum Foils (aluminum No. 1 and aluminum No. 2), but also any other suitable metals in the table of elements that contains the fewest atoms (Si may be one of several such example) can be used in place of the aluminum foils. The aluminum or other metal foils are attached on both sides of a ferrite magnet. A filter may be used to not have a direct contact between the magnet and the aluminum foils. One embodiment utilizes a rubber magnet of about 1/16" width or thickness with an alternating 2 mm interval between north and south and having north south portions connected to each other in an alternating fashion, as shown in the drawings to be described below. Another embodiment of the invention is the magnetizing of a silicon plate with neodymium, AlNico, NdFeB, or ferrite powder and may have various magnetic powder coatings.

The applying of the coating to silicon may comprise different methods. One is the by implementation of magnetic metals directly on the silicon, and the film is preferably very thin and produces very low magnetic field. The other is by making the surface of silicon rough and then implementing the magnetic metals. This method of implementation produced a thicker coating and gave a better magnetic field. A third method was implementing titanic metal or similar on the silicon and then implementing the magnetic metals. The result may be better than other embodiments. Also, it is possible to mix silicon with magnetic material similar to that of a rubber magnet.

In the use of a rubber magnet with one side magnetized, the rubber is considered as a filter for that side. This also applies to the silicon plate. On this sample, a single pole magnet was used without N-S alternating. This sample also generated electricity almost as well as other samples with alternating N-S (see FIG. 5). Applying pressure into the system increases both voltage and amperage.

The thickness of the magnet and/or the metal as well as the strength of magnet, and the interval between the north and the south poles, has a large effect on the magnetite and on the voltage and the amperage of the system. Also, applying titanium on the silicon which may occur prior to the powder coating resulted in an increase of amperage of about 10% to 15%. Furthermore, the strength and thickness of metals may have a similar effect. The storm of mass particles produced by a magnet will move mass particles within atomic clouds from the Aluminum (1) foil layer to the Aluminum (2) foil layer. This movement of masses starts the flow of mass particles in the system. After a few seconds, the flow will be mostly from the magnet to the Aluminum (2) foil layer.

This movement of mass particles can be stopped or substantially reduced from exiting from the field by adding another metal from the table of elements with a higher group of atoms, attached to the stronger magnetized side (if one side is stronger), of the magnet over the Aluminum 1 (see FIG. 1). One option used for the additional metal layer is that of an approximately 5/264" copper layer. Another option used for the additional metal layer is that of an approximately 0.027" copper layer. Variations in the thickness of such layer all within the scope of this invention. Elements in a higher group in the Table of Elements may be better elements to be used for the reduction of number of particles exiting the field. One example may comprise the use of lead (Pb). The use of rubber magnets that have north and south alternating next to each other may bring the highest storm within the field. As the distance between the north and south polarities of the magnet decreases, efficiency and output of the system may increase.

Connecting wires to the copper, and the second end of the wire to the neutral side of magnet, such as by attaching a metal to the side of the magnet which is the non-magnetized edge of the magnet that is neither north or south, will produce a differential in charge (mass particles). Charges will flow within the system and this produces electricity. Because of north-south (N, S, N, S, as seen in the drawing) arrangement relative to each other in the magnet, the storm may increase the flow. The voltage of the system has some differential depending on which natural side of magnet may be used for the second wire application. In the case of silicon and a single pole the wire should be connected to the aluminum side and edge or surface of the magnet.

In one embodiment, a diode may be installed in the system that reduces the two directional movements of charges inside the wire, and this will help to increase the amount of voltage and amperage in the system.

In one embodiment of the invention, the voltage obtained from each cell with aluminum foil, with an overall dimension of 1"×1"×0.0505", may be over 620 mil. volts DC and also at the same time measured around 2 mil. volts of AC. In another embodiment of the invention, the voltage obtained from each cell with aluminum foil, with an overall dimension of 1"×1"×0.11", may be over 390 mil. volts DC and also at the same time measured around 50 mil. volts of AC.

In yet another embodiment, made out of cells of aluminum plates 1 and 2 with an Aluminum thickness of approximately 1/16" and two layers of copper with the same thickness and the same magnet, the voltage of this system was around 390 mil. volts, and the voltage of the AC was almost the same. The amperage of the system with aluminum foil was much larger in number than that of the metal plates.

As the distance between the north and south of the magnet deceases, efficiency and output of the system may increase. Connecting a wire along any neutral edge may produce more amperage. If a wire is connected to each three other sides of the neutral of the rubber magnet, and connected to each other, the amperage will be increased by or according to the number of the neutral sides to which wires have been added. By connecting the wire and adding another side to the magnet neutral, the amperage of the system may be doubled. If one more side is added to the neutral wire the amperage may be tripled and the same may be so for the fourth side. Further, as the model gets larger or smaller in thickness and sizes, there may not be much of a change in output voltage. The smallest model in accordance with one embodiment of the invention was ½"×½×0.189" and the voltage detected was almost the same as some of the other ones described above, indicating that the size could be smaller with the same or similar output and with probably more amperage as the larger size. Also, it has been observed that each edge of the system may have separate voltage and amperage. Therefore, from each side energy can be released separately. This may only apply in the case of the rubber magnet and when silicon is mixed with the magnet. For the embodiment utilizing implementation of magnetic metal to silicon, the edge or the surface may be the same. By removing the Aluminum 1 from the system, the same voltage may be obtained, but it may take longer a time for the voltage to appear in the system.

With reference to FIG. 5, contingent on how the magnetization is created and behaving, the wire connecting to the copper may also be connected to the aluminum foil 2. Applying film between the copper and aluminum 2 layer may well reduce deterioration of both metals (FIG. 1).

This electric device or generator of the invention has been tested by applying loads for periods of weeks, but the voltage did not drop after removing the loads. In addition, after shorting wires for periods of days, or even months, upon removal of the shortage, the same voltage was measured and the flow of electricity started as normal. The life of the first built generator may be over 18 months and indicates that as time passes the amperage of the system increases the same or more output of voltage is being obtained. The life of the generator may be over 48 months, in one embodiment. The tests showed that the system is generating electricity constantly. The estimated life may be influenced by the deterioration of the metals, or magnet becoming weaker.

In order to increase voltage, the cells may be connected in series. In order to increase amperage, they may be connected in parallel (see FIGS. 2 and 3). To obtain best results, the cells may be connected in parallel, connecting all Aluminum cells together as shown in FIG. 4 or 6. The number of cells can be connected in parallel or in a series; after a certain number of cells, connection should preferably be done through diodes.

Another embodiment in accordance with the present invention comprises one having dimensions of approximately ¼"×¼", and it was found that the amperage dropped, possibly because the north south magnet was not provided for in that model. Each north or south of the magnet may be approximately 0.20" and 0.25". The same experiment has been done with a ceramic ferrite magnet, and the voltage was the same, but it took more time until voltage appeared in the system. Further, the amperage was less than the other models.

In a further embodiment, the voltage obtained from each cell with aluminum foil with an overall dimension of 1"×1"× 0.0505" is over 520 mil. volts DC and also at the same time around 2 mil. volts of AC were measured. Another embodiment was comprised of cells of aluminum plates 1 and 2 with an aluminum thickness of ¹⁄₁₆" and two layers of copper with the same thickness and the same magnet. Almost the same voltage came out of this cell, but the AC voltage from the system was, however, the same as DC voltage (520 mil. Volt). The amperage of the system with aluminum foil was much bigger in number than certain other metal plates. Connecting a wire along the edge or another suitable location may produce more amperage. Connecting the wire and further adding another side to the magnet neutral, the amperage of the system may be doubled. If one more side is added to the neutral wire the amperage may be tripled and the same for the fourth side. Also, it is noted that as the model gets larger or smaller in thickness and sizes, there will be not much of a change in output voltage. The smallest model made was ½"×½"×0.189", and the voltage was almost the same as the other ones described, indicating that the size could well be smaller with the same output with probably more amperage than the larger size.

Applying a film between the aluminum (2) foil layer and the copper layer may reduce deterioration of the metals.

The use of diodes may reduce the voltage of a system by approximately 0.7V. By adding a diode to the system of one cell unit, the voltage of the system did not appear to drop. The voltage maintained in the system is mostly due to converting portion of AC voltage to DC. Therefore if a diode is added to the system of several cells, the voltage of the system may be much more than 400 mil. Volt multiplied by the number of cells. See FIG. 2 of the drawings.

The electric generator of the present invention has been tested by applying loads for period of weeks, but the voltage did not drop after removing the loads. Also after shorting wires for a period of days the same voltage has been measured. The life of the first built generator was over 18 months, and potentially over 24 months, with the same or more output of voltage being obtained. The life of this generator may be over 36 months, or even as much as 48 months. These tests showed that the system is generating electricity constantly. The estimated life could be related on the deterioration of the metals, or as a result of the magnet becoming weaker.

In order to increase voltage, or amperage of these cells, they may act like a battery. To increase voltage the cells should be connected in series and to increase amperage in parallel. The number of cells can be connected in parallel or in series, and after a certain number of cells the connection should be effected through diodes.

BRIEF DESCRIPTION OF THE DRAWINGS

In the drawings:

FIGS. 7A, 7B, 7C, 7D, 7E and 7F illustrate different views of a plate constructed and configured in accordance with a further aspect of the invention;

FIGS. 8A, 8B, 8C, 8D and 8E illustrate different views of a plate constructed and configured in accordance with yet a further aspect of the invention;

DETAILED DESCRIPTION OF THE INVENTION

Reference is now made to the accompanying drawings, which shows schematically the features and components of the electric device in accordance with one aspect of the invention.

Figure 1:
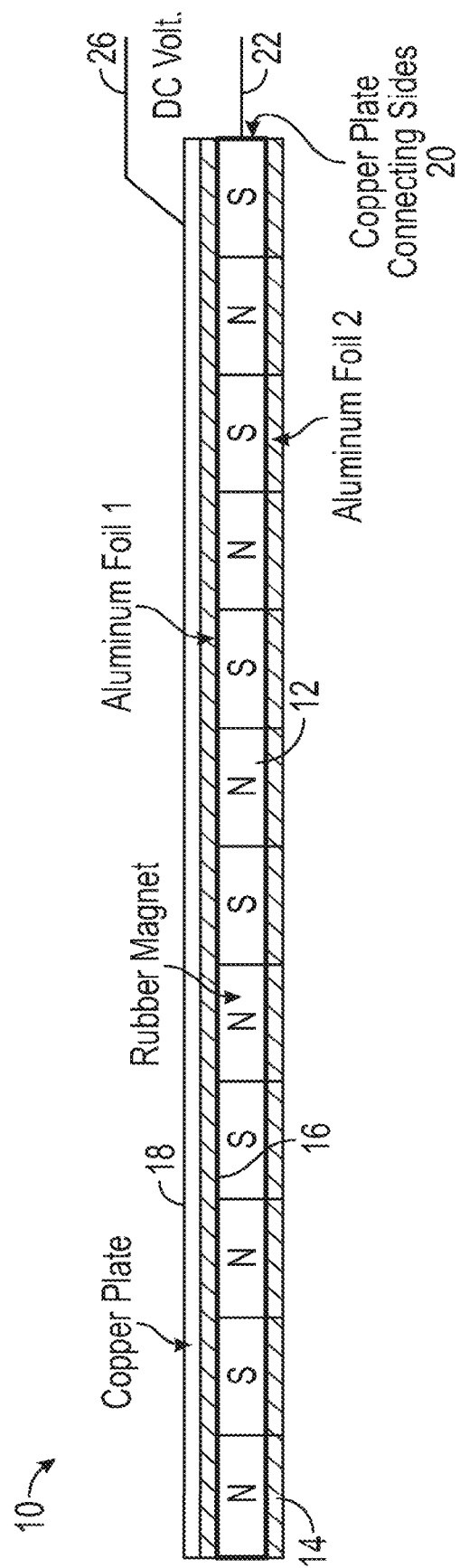
FIG. 1 is a schematic view of an electric device component in accordance with one aspect of the invention.

In FIG. 1 of the drawings, there is shown an electric generator component 10 generally comprised of a substantially flat magnet 12 having an alternating series of north and south polarities. The magnet 12 has a lower surface to which is attached a first aluminum foil strip layer 14, and an upper surface to which is attached a second aluminum foil strip layer 16. The magnet itself in the embodiment illustrated in this figure is approximately 15/256 inch thickness, although the invention is not limited to such a thickness, and magnets of varying thickness according to the needs and parameters of the system may be used. Further, the magnet 12 is a rubber magnet, and may be flexible.

A copper plate layer 18 is mounted over the second aluminum foil strip layer 16. A terminal 20 extends from an edge of the magnet 16, and a wire 22 is connected thereto. The wire 22 may include a diode 24. A further wire 26 is connected to the copper plate 18. The wires are used to harness the power and energy generated by the electric device of the present invention.

Figure 2:
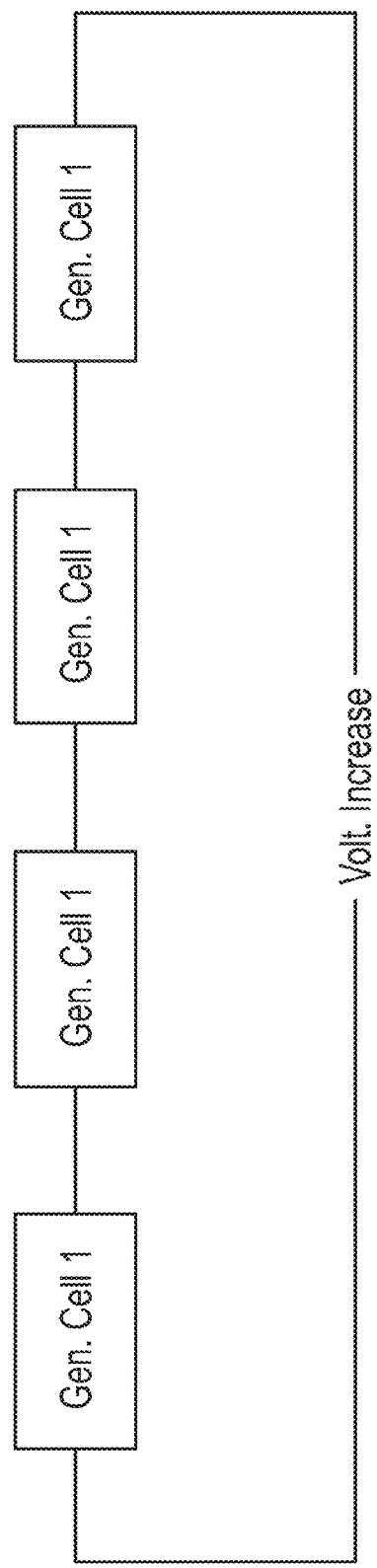
FIGS. 2 and 3 are a schematic representations of four and five such electric devices hooked together in series and in parallel respectively.

As shown in FIG. 2 of the drawings, a series of electric generators, which may be of the type illustrated in FIG. 1 of the drawings, or differently configured electric generators having different thicknesses and dimensions, may be connected together. FIG. 2 shows a series of four electric generators connected together, to exemplify the arrangement, but the invention is not limited to this number and any suitable number of electric generators may be joined. FIG. 2 of the drawings shows, separately, four electric generators which are joined in series, and four electric generators joined in parallel as shown in FIG. 3, each arrangement being configured so as to optimally generate voltage or amperage, as discussed above.

Figure 3:
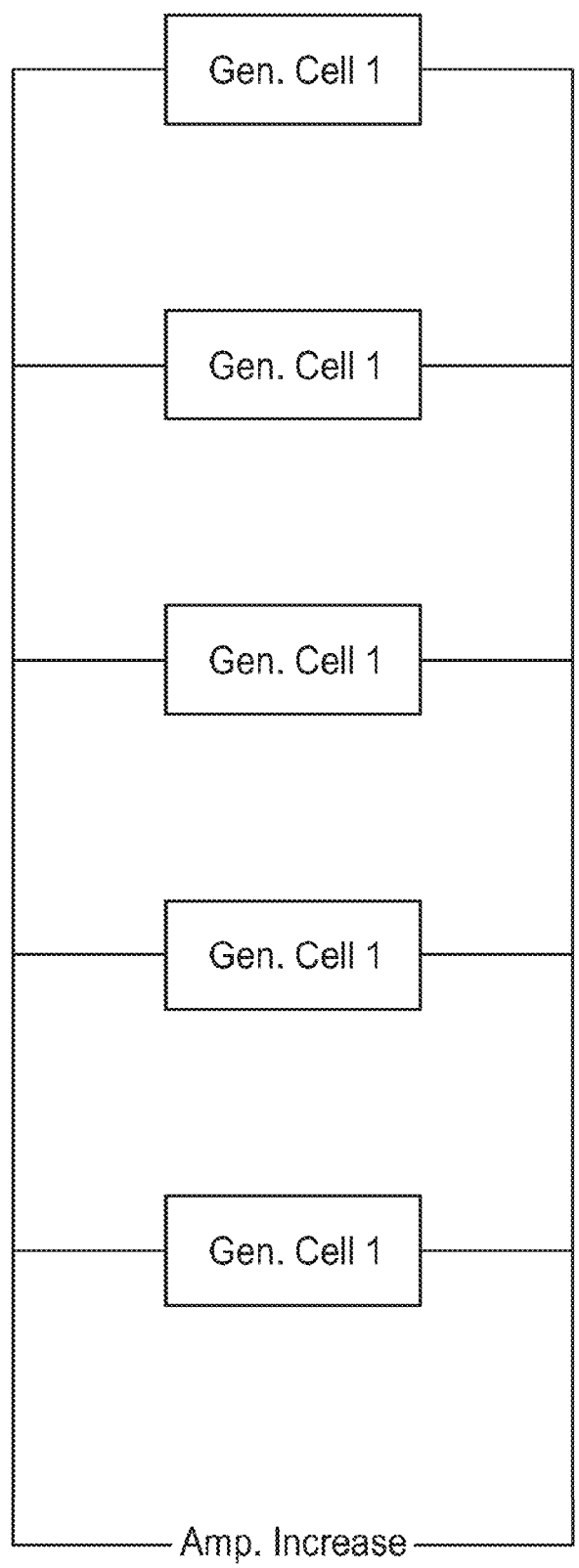

FIG. 3 of the drawings illustrates a series of cells in parallel.

Figure 4:
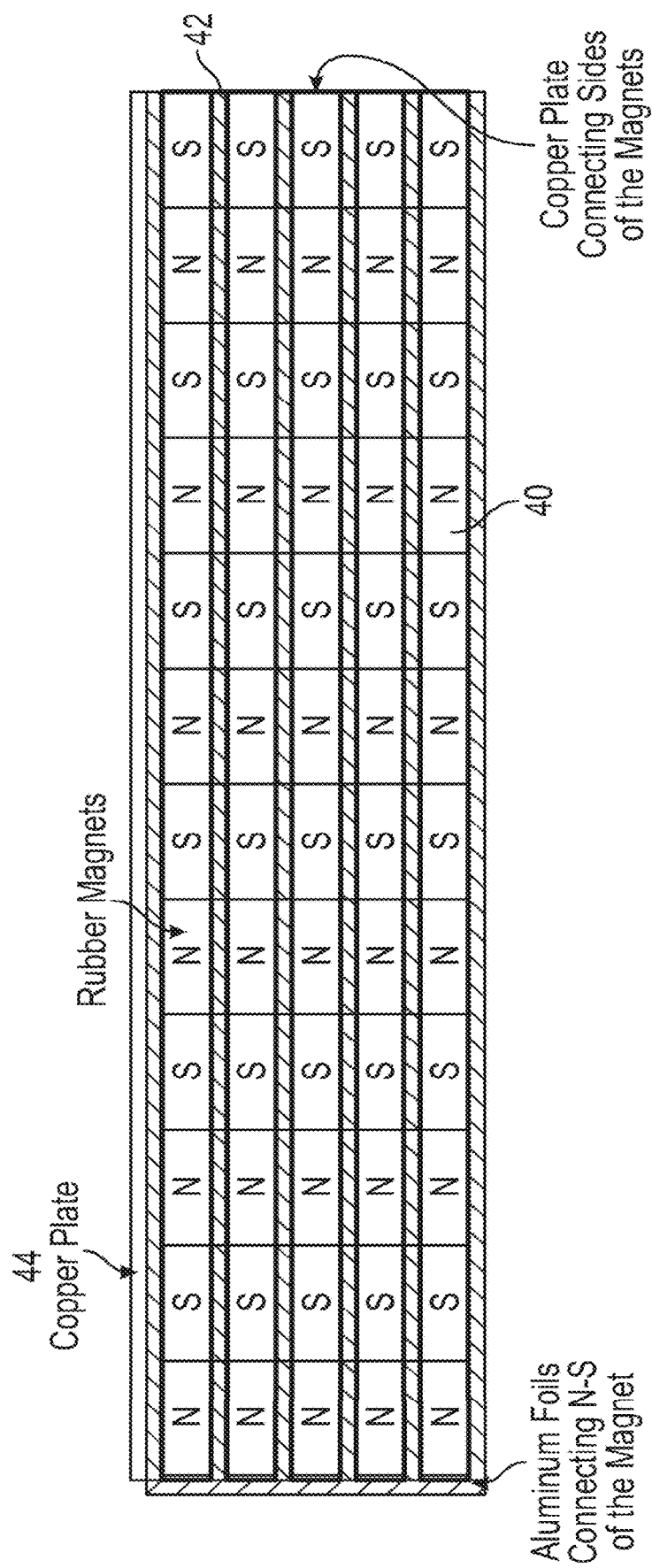
FIG. 4 illustrates a series of cells connected together in parallel in accordance with an aspect of the invention.

FIG. 4 of the drawings illustrates a further embodiment of the invention comprising a series of stacked magnets 40 each having alternating north and south polarities. As will be noted, the north polarity of each magnet is above and below the north polarity of an adjacent magnet, and the same applies to the south polarities. A copper plate 42 connects the side of the magnets 40. Further, a copper plate 44 is mounted on the top magnet in the stack. Aluminum foils are also provided, and extend between each one of the magnets in the stack, as well as on one side of the stack. The aluminum foils are also located below the lowest rubber magnet 40, and between the top rubber magnet 40 and the copper plate 42. The embodiment of the invention illustrated in this figure of the drawings may be connected as described with reference to other embodiments of the invention above. It is to be noted that, while five stacks of rubber magnets 40 are shown in FIG. 4 of the drawings, other numbers of stacked magnets can be used within the scope of the invention. In addition, each rubber magnet in the stack need not be of identical length. Further, the aluminum foils may be located between or adjacent the magnets in other different configurations. The copper plate 42 may also be attached in a different location.

Figure 5:
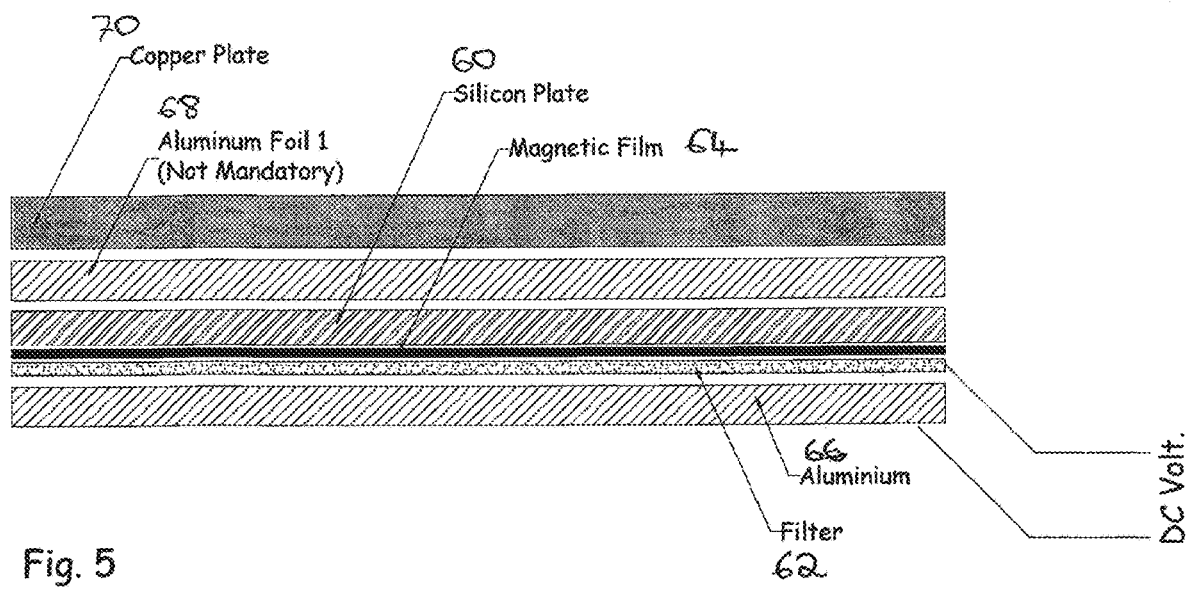
FIG. 5 illustrates a further embodiment of the invention including the use of a silicon plate.

FIG. 5 of the drawings illustrates a device in accordance with one aspect of the invention, including the use of a silicon plate 60 and a filter 62. A magnetic film 64 has the filter 62 on the lower side thereof, and an aluminum layer 66 on the opposing side of the filter 62. The magnetic film 64 has the silicon plate 60 on its other surface, followed by the aluminum foil layer 68, which may be optional, and a copper plate 70 at the top. This figure further illustrates the positioning for the DC voltage connection.

Figure 6:
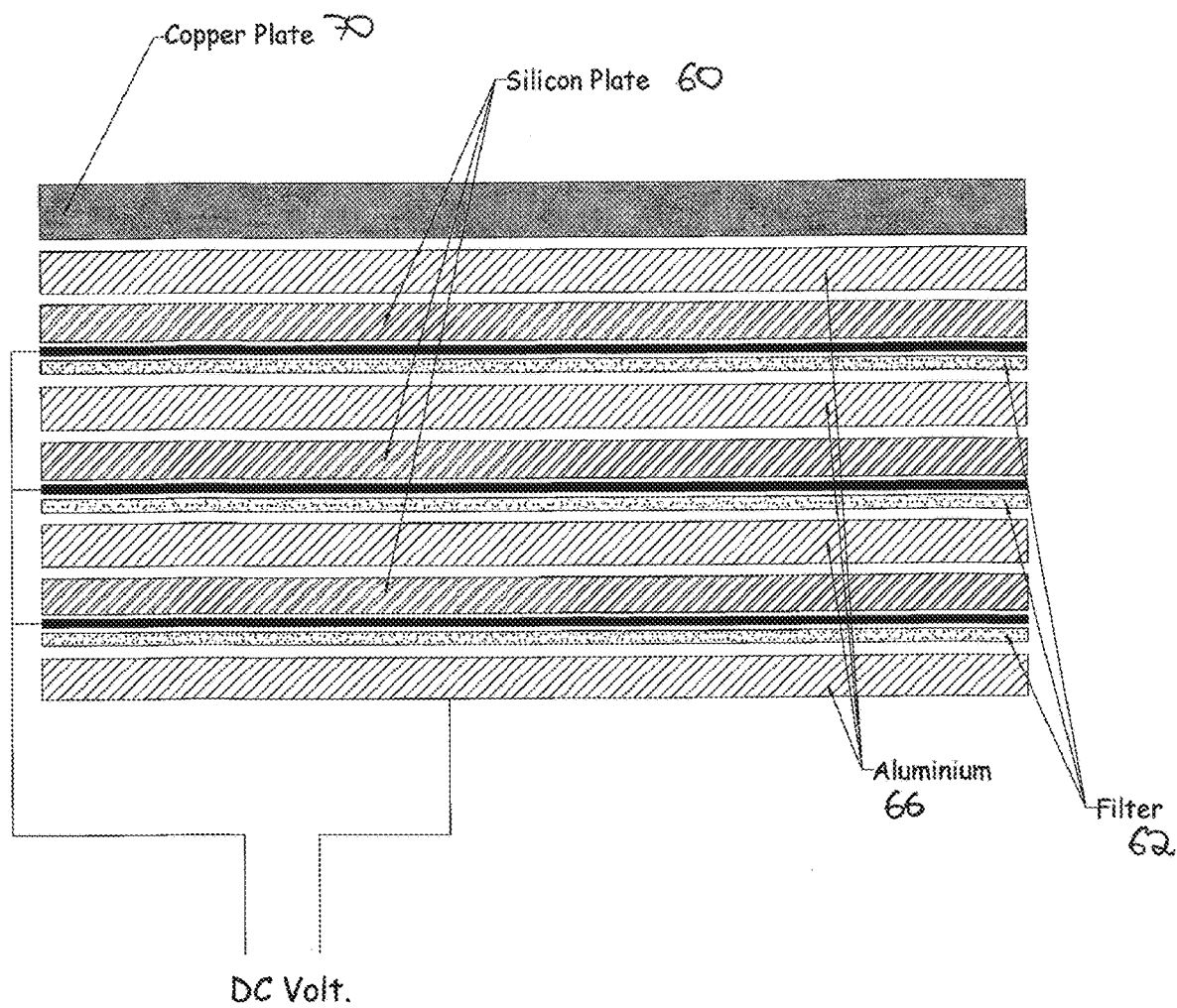
FIG. 6 shows a further embodiment with the silicon plates used in multiple layers.

FIG. 6 of the drawings illustrates a similar configuration as shown in FIG. 5, but with multiple magnetic film layers, and those layers associated with these layers, including the multiple silicon plates and multiple filter plate layers. This figure further illustrates the positioning for the DC voltage connections.

Reference is now made to the various illustrations comprising FIG. 7 of the drawings, which shows half inch by half inch plates constructed in accordance with the present invention. FIG. 7A shows a top view of a plate comprising a silicon wafer 90, which may be 0.5"×0.5" in length and width, although different embodiments of the invention may have different dimensions, and the invention is not limited to this particular size.

Along one edge, there is shown a AlNico 5 or Neodymium based magnets (NdFeB). This figure also illustrates the magnetizing north-south direction relative to the silicon wafer 90. Note that the magnetizing will, in a preferred embodiment, occur off to the various layers and components have been constructed.

FIG. 7B illustrates a view of the device of the invention along Section A-A as shown in FIG. 7A of the drawings, including the magnetizing direction. FIG. 7C shows a view of the device along Section B-B as shown in FIG. 7A of the drawings, including the magnetizing direction.

FIG. 7D shows a detail at the bottom of one of several or plurality of channel areas as shown in FIG. 7B. FIG. 7D shows the surrounding silicon wafer 90, with the channel 100. The channel 100 is aligned with layered material, including an outer layer of aluminum 98, a nonconductive material 96 inside the aluminum 98, and the magnets as mentioned above 92. A V-shaped groove 102 or carved section or area extends from the channel 102 just into the silicone layer 90.

In FIG. 7 of the drawings, there is shown a detail of the layering on the silicon wafer 90. The outermost layer comprises aluminum 98, with a nonconductive layer 96 thereunder. The magnets 92 are configured therebelow.

FIG. 7E of the drawings shows a reference chart of the various components shown layered on the silicon wafer, and the steps for assembly.

As shown in FIG. 7C, wires are connected at opposite ends of the silicone wafer. Preferably, one wire is connected to the copper layer, while the other is connected to the magnetic layer.

In producing a silicone wafer device of the type illustrated in this figure, the first step is to mask and cut trenches to preselected sizes on the wafer, as illustrated. Thereafter, AlNico 5 or Neodymium based magnets (NdFeB) are layered thereon, followed by the application of the nonconductive material 96. A layer of aluminum 98 is then applied, followed by the layer of copper 94 at one end. Thereafter, a carve area is made, as shown in the section A-A, or FIG. 7B.

The area carved comprises the channel 102 as shown in FIG. 7D of the drawing. A strong magnetizing action is thereafter applied to the device.

The basic design of this device continues to use copper, aluminum, rubber magnet, and aluminum. The robber magnet on a flat surface works not only as a magnet but also as a non-conductive layer between magnet and two layers of aluminum foils. In one embodiment, for each cell of the device, the silicon wafer works as a base of support for all the materials. Then there is a layer of aluminum, non-conductive material, magnet material, silicon as support, magnet material, non-conductive and aluminum layer as per section A-A in FIG. 7D. The copper is applied only at the beginning of each row of the device as before when they are as series.

The grooves separate each row from the other adjacent rows. In this way, each row can become a series of batteries connected in series with the aluminum layer.

This electric device may comprise a generator which is made from a silicon wafer as substrate. The wafer is grooved as shown in the figures into sizes, in one embodiment, of 200 to 250 Micron in width and 100 to 150 Micron in height and 20 to 40 Micron in depth. It is deposited with 13 to 20 Micron of either AlNico, or Samarium-Cobalt (SmCo), or Neodymium on the wafer. Then a nonconductive coating such as for example SiO2 is applied on top of the magnetic material. Thereafter, a coating of 1 to 2 micron of aluminum will be applied on the non-conductive layer. The wafer will be grooved as shown in the various figures in order to disconnect all the materials from each other up to silicon wafer in each row.

Then the wafer is cut to the size of 0.5"×0.5", according to one embodiment, and a 1 to 2 Micron layer of copper is applied at one end of it as shown in the figures. There is a wire connection on the copper and magnetic material for each row of the material as seen in FIG. 7C of the drawings. Thereafter, the 0.5" square device is magnetized in the direction as shown in the figures (such as FIG. 7A). The Voltage that was measured in one test for each row was up to 2.9V, as follows:

| Magnet thickness Micron | Voltage |
|---|---|
| 6.5 | .550 |
| 9 | 1.01 |
| 13.5 | 2.99 |

The amperages of the system also increases as the thickness increases.

Reference is now made to FIGS. 8A, 8B, 8C, 8D and 8E of the drawings. In these figures, a somewhat related embodiment is shown to those illustrated in the figures above and as described above, but with variations in the construction, configuration, layering and certain other attributes including use of materials of the device of the invention.

The electric device, or magnetic device, or generator of the invention is constructed from and comprised of a layer of aluminum "1", parylene which is used as a non-conductive material, a magnet such as AlNico, SmCo, or Neodymium, and another or second layer of parylene for protection against corrosion. A copper layer is provided at the end portion of the system, and parylene added thereto to protect the copper.

Figure 9:
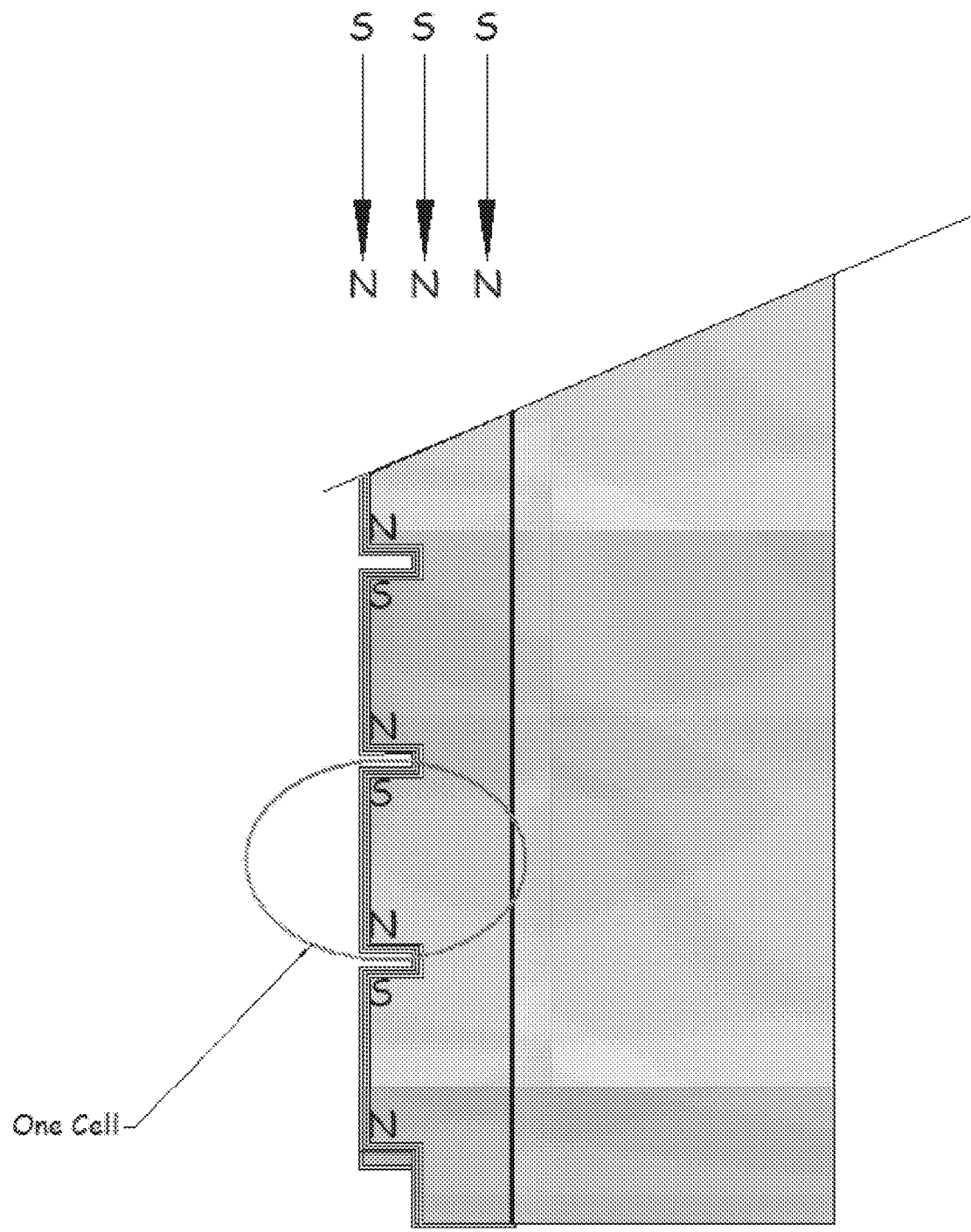
FIG. 9 illustrates a detailed view of a device constructed in accordance with the invention in cross-section and showing grooves or channels.

The magnetizing direction in each of the cells can be seen in FIG. 9 of the drawings.

The north pole of a magnet with a strong directional flow of mass particles absorbs part of the mass particles of atomic clouds from the aluminum 1 layer and deposits it to the atomic clouds of the aluminum 2 layer. This action is continued until the end where the copper layer is reached. Copper, which has the higher electron count around its nucleus, makes is harder for the mass particles to exit the system. Atomic clouds of the aluminum 2 layer that absorbed too many mass particles transfer these extra mass particles to the next cell of the aluminum 1 layer and this action continues cell by cell, until it reaches to copper layer that prevents partially the exiting of these mass particles. Please see FIG. 10 of the drawings.

Figure 11:
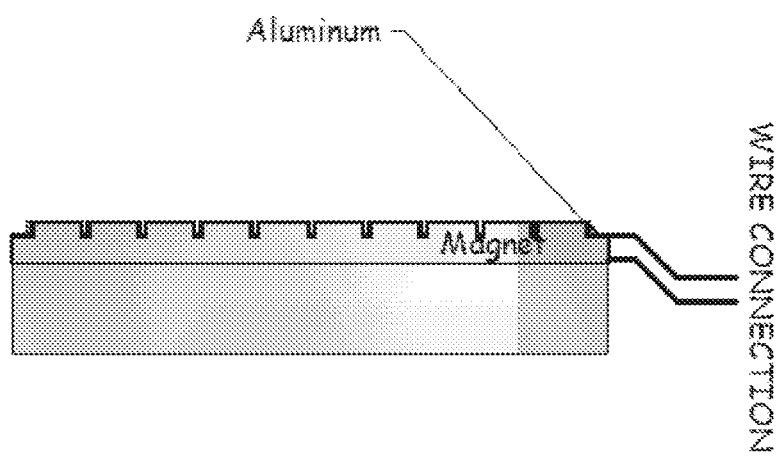
FIG. 11 illustrates a detailed view showing a connection of wires to the electric device of the invention in accordance with one embodiment.

The wire connection to the aluminum layer is the mechanism by means of which these particles can exit from the system, in accordance with one embodiment of the invention. The desire of the magnet to absorb mass particles and the exited particles from the aluminum layer by means of the connected wire provides a differential potential in voltage in these two wires (which is the system voltage). Please see FIG. 11 of the drawings.

It has been found that the velocity of mass particles moving from the aluminum layer wire to the magnet connected wire produces amperage. This action provides energy (Energy=mass in motion) into the system (W=Voltage× Amperage).

In accordance with one aspect of the invention, the measured voltage between the magnet and the aluminum was found to be approximately 3. Volts. Thus, one unique aspect of the invention relates to the electric device which may operate as a generator, in which one of the wire poles is attached to the magnet itself.

In the past, in generators that have been built the power connection is either to a coil, or to a circuit. However, the device of the invention is constructed uniquely in that the power connection is on one pole and is a metal, and the magnet by itself on the other pole.

The following describes one aspect and embodiment of the method and steps for the manufacture and production of the device of the invention.

(1) Obtain magnet material (such as Neodymium (NdFeB)) as per following specifications that is an example of a production:
- (A) 500 Micron thick of (NdFeB) or similar magnet material.
- (B) ⅛" or less thick of aluminum plate.
- (C) Conductive Glue
- (D) Then paste the NdFeB onto the aluminum plate with the conductive glue
- E. See FIG. 8

(2) The next step is to laser groove the NdFeB to size. In one embodiment, this may be a selected as being 300×100 Micron by 100 Micron deep. The distance between the cubes in the direction of magnetization is 200 Micron, and the distance in the other direction is 500 Micron. See FIG. 8D (Detail A)

(3) Applying the Non-Conductive is the next step. In this regard, parylene material applied in a vacuum to cover the magnet (NeFeB) completely.

(4) The back and side of aluminum plate is masked in a manner such that only parylene may be exposed. Thereafter, aluminum is applied in vacuum, of approximately 1 to 2 Microns in thickness.

(5) All the non wanted areas are masked and a layer of copper is applied in the same way as illustrated in the designated area as per FIG. 8.

(6) The area per FIG. 8D (Detail A) is carved, to separate each row from the other rows. After carving, each row may act as one generator with its own characteristics. Cells in each row have been found to have equal voltage. Therefore, the voltage of each row equals to voltage of each cell, and the amperage of the row of cells is equal to the number of the cells in each row multiply by the amperage of each cell.

(7) The sample so constructed is then magnetized, in the direction as shown in FIG. 8. Note that the magnetization occurs after the device is constructed, and not before.

By heating the magnet, the magnitude of the magnet will be reduced. Further, at a certain reduction of the magnitude, the maximum stable voltage can preferably be obtained. In a high magnitude magnet, the voltage will fluctuate at any period of time. With the heating and reduction of the magnitude of the magnet, the voltage will be stabilized and the maximum or more optimal voltage will be obtained.

All of the dimensions and thicknesses may vary. Different thickness or sizes will result in the variation of voltage and amperage of the system. To obtain maximum voltage and/or amperage, it may be necessary in one embodiment of the invention to vary the sizes of the cubes, the aluminum thickness, the copper thickness, and importantly the size and the magnitude of the magnet.

The device of the invention may have application in many contexts and provide industrial use of the device in a range of different manners.

One area of use may be to build a device to hold charge in cell phones for long periods, even years, without charging the cell phone every night or as often. The size of this device may be ¼"×¼"×1" and it may be connected to the charging socket of the cell phone. Potentially, replacing of all the cell phone batteries with this device may result in no charging, or very infrequent charging of the smart phone device. The same may be applicable for all electronic devices (such as laptops, tablets, computers, etc). The invention may also be utilized with the batteries in electric vehicles. The cost is potentially substantially lower than currently available batteries, and may eventually cost only 10% thereof. Further, the weight is much less, possibly about up to ⅕th of the weight of existing batteries. Very little charging may be required.

Figure 10:
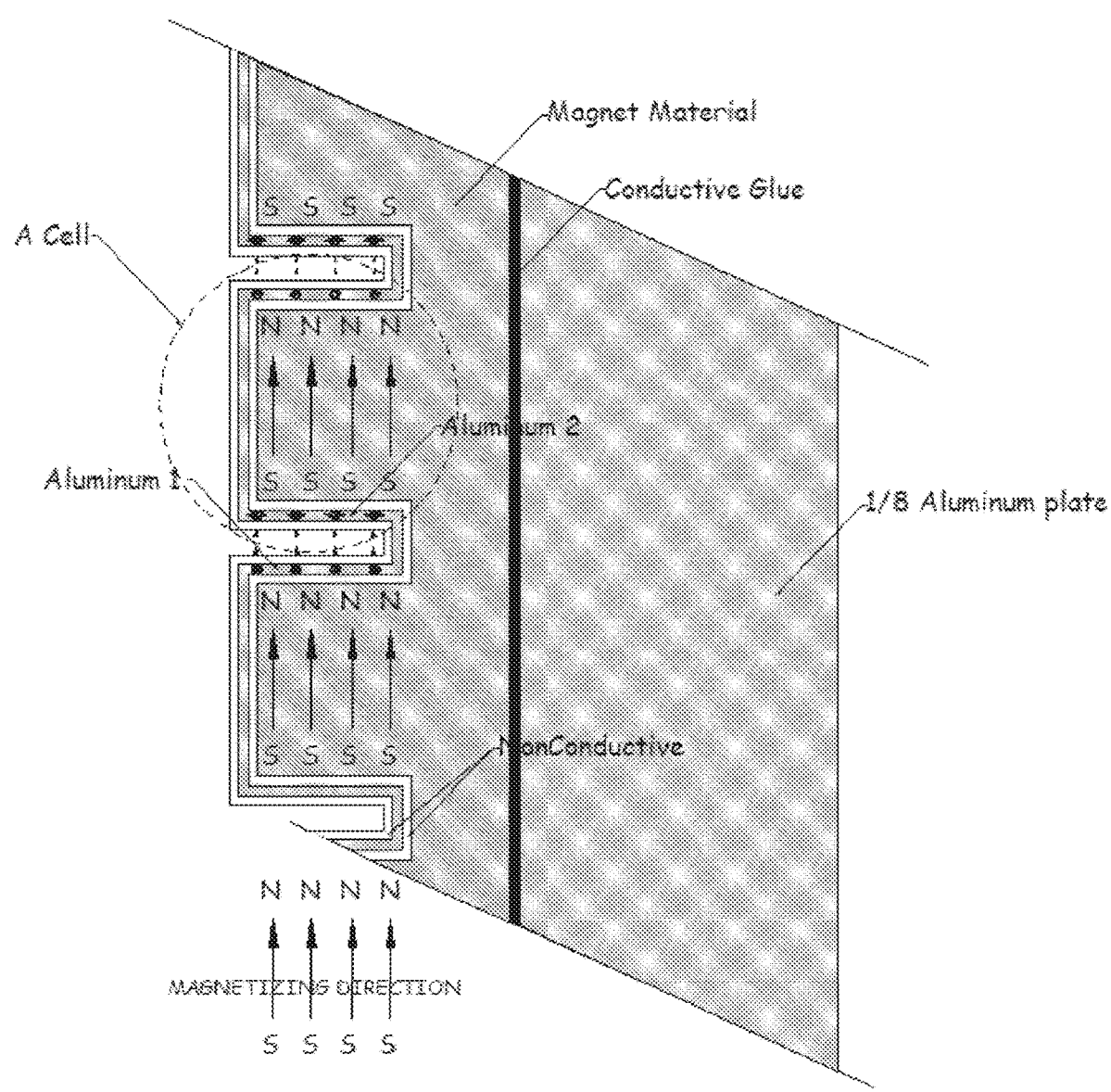
FIG. 10 illustrates a more detailed view of the channels and layers thereof, and the direction of magnetization.

The particular structure of this embodiment can be seen in several of the FIGS. 8 to 11. For example, FIG. 10 shows the aluminum plate connected to the magnet material by means of a conductive glue. A series of preferably equi-spaced channels are constructed into the magnet material, downwardly from the surface thereof opposite to that which connects to the aluminum plate through the conduct of glue. Within the groove, there is placed a layer of nonconductive parylene (or other nonconductive) material, followed by a layer of aluminum, which is itself topped by a second nonconductive parylene material (or other nonconductive material). The north south polarities configuration is clearly illustrated, such as in FIG. 10. In this embodiment, a cell represents the space between two adjacent grooves. This electric device is magnetized after construction, in the magnetizing direction illustrated in these figures.

The invention also has potential application in buildings and structures. These may be removed from the electric power grid, even permanently. Such inexpensive and extensive supplies of electricity for use by customers is a further potential advantage of the invention.

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

The invention claimed is:

1. An electric device comprising:
    a magnetized component having a series of alternating north and south polarities;
    a first metal layer formed on a first magnetized surface of the magnetized component;
    a second metal layer formed on a second magnetized surface opposed of the first magnetized surface; and
    a pair of wires comprising a first wire connected to the first metal layer or the second metal layer, and a second wire connected to a neutral side of the magnetized component.

2. The electric device of claim 1, wherein the first metal layer is comprised of aluminum foil.

3. The electric device of claim 1, wherein the second metal layer is comprised of aluminum foil.

4. The electric device of claim 1, wherein either the first metal layer or the second metal layer comprises two layers formed of a first metal and a second metal.

5. The electric device of claim 4, wherein the second metal has a higher group of atoms than the group of atoms of the first metal.

6. The electric device of claim 4, wherein the second metal is copper and the first metal is aluminum.

7. The electric device of claim 4, wherein the first wire is connected to the second metal.

8. The electric device of claim 1, further comprising a filter layer located between the first magnetized surface and the first metal layer or between the second magnetized surface and the second metal layer.

9. The electric device of claim 8, wherein the filter layer is comprised of non-conductive material.

10. An electric generator device comprising a plurality of the electric devices of claim 1 connected to each other.

11. A method of generating electricity comprising:
    providing a magnetized component having a series of alternating north and south polarities;

placing a first metal layer on a first magnetized surface of the magnetized component;

placing a second metal layer on a second magnetized surface opposed of the first magnetized surface; and connecting a first wire of a pair of wires to the first metal layer or the second metal layer, and a second wire of the pair of wires to a neutral side of the magnetized component.

12. The method of claim 11, wherein the first metal layer is comprised of aluminum foil.

13. The method of claim 11, wherein the second metal layer is comprised of aluminum foil.

14. The method of claim 11, wherein either the first metal layer or the second metal layer comprises two layers formed of a first metal and a second metal.

15. The method of claim 14, wherein the second metal has a higher group of atoms than the group of atoms of the first metal.

16. The method of claim 14, wherein the second metal is copper and the first metal is aluminum.

17. The method of claim 14, wherein the first wire is connected to the second metal.

18. The method of claim 11, further comprising providing a filter layer between the first magnetized surface and the first metal layer or between the second magnetized surface and the second metal layer.

19. The method of claim 18, wherein the filter layer is comprised of non-conductive material.

\* \* \* \* \*